United States Patent
Wang et al.

(10) Patent No.: US 9,341,671 B2
(45) Date of Patent: May 17, 2016

(54) TESTING HOLDERS FOR CHIP UNIT AND DIE PACKAGE

(71) Applicant: Taiwan Semiconductor Manufacturing Company, Ltd., Hsinchu (TW)

(72) Inventors: Mill-Jer Wang, Hsinchu (TW);
Kuo-Chuan Liu, Hsinchu (TW);
Ching-Nen Peng, Hsinchu (TW);
Hung-Chih Lin, Hsinchu (TW); Hao Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 497 days.

(21) Appl. No.: 13/830,525

(22) Filed: Mar. 14, 2013

(65) Prior Publication Data

US 2014/0266281 A1    Sep. 18, 2014

(51) Int. Cl.
*G01R 31/00* (2006.01)
*G01R 31/28* (2006.01)
*G01R 1/04* (2006.01)
*G01R 31/3185* (2006.01)

(52) U.S. Cl.
CPC .......... *G01R 31/2867* (2013.01); *G01R 1/0483* (2013.01); *G01R 31/2875* (2013.01); *G01R 31/318513* (2013.01)

(58) Field of Classification Search
CPC ........... G01R 31/2867; G01R 31/2875; G01R 31/318513; G01R 1/0483

USPC .......... 324/756.02, 756.07; 279/4.06, 14, 906
See application file for complete search history.

(56) References Cited

U.S. PATENT DOCUMENTS

| | | | | |
|---|---|---|---|---|
| 4,725,918 A | * | 2/1988 | Bakker | H01L 21/67356 324/750.26 |
| 5,159,535 A | * | 10/1992 | Desai | H01L 23/4985 257/E21.705 |
| 5,170,931 A | * | 12/1992 | Desai | H01L 23/4985 228/180.22 |
| 5,201,451 A | * | 4/1993 | Desai | H01L 23/4985 228/44.7 |
| 5,800,194 A | * | 9/1998 | Yamagishi | H05K 7/1084 439/264 |

(Continued)

FOREIGN PATENT DOCUMENTS

JP    2009-156696 A    *    7/2009

*Primary Examiner* — Patrick Assouad
*Assistant Examiner* — Sean Curtis
(74) *Attorney, Agent, or Firm* — McDermott Will & Emery LLP

(57) ABSTRACT

A testing holder for a chip unit, a multi site holding frame for plural chip units and a method for testing a die thereof are provided. The proposed multi site holding frame for testing plural chip units simultaneously includes a first holder frame having a plurality of testing holders. Each of the plurality of testing holders includes a holder body containing a specific one of the plural chip units, and a pressure releasing device formed on the holder body to release an insertion pressure when the specific one of the plural chip units is inserted in the holder body.

20 Claims, 14 Drawing Sheets

(56) References Cited

U.S. PATENT DOCUMENTS

| | | | |
|---|---|---|---|
| 5,847,572 A * | 12/1998 | Iwasaki | G01R 1/0433 324/754.08 |
| 5,920,200 A * | 7/1999 | Pendse | G01R 1/06705 324/750.25 |
| 6,057,700 A * | 5/2000 | Crispell | G01R 1/0433 324/750.25 |
| 6,155,859 A * | 12/2000 | Choy | H01R 13/62933 439/331 |
| 6,213,806 B1 * | 4/2001 | Choy | H05K 7/1069 439/331 |
| 6,369,595 B1 * | 4/2002 | Farnworth | G01R 1/0483 324/756.02 |
| 7,156,680 B2 * | 1/2007 | Saito | G01R 1/0433 439/331 |
| 7,232,328 B2 * | 6/2007 | Saito | G01R 1/0433 439/331 |
| 7,667,475 B2 * | 2/2010 | Steps | G01R 31/2863 324/750.01 |
| 7,704,735 B2 * | 4/2010 | Facer | B01L 3/502707 435/303.1 |
| 7,737,710 B2 * | 6/2010 | Cho | G01R 1/0483 257/48 |
| 7,862,363 B2 * | 1/2011 | Chen | H05K 7/1007 324/756.02 |
| 8,622,198 B2 * | 1/2014 | Yamazaki | G01R 31/2893 198/468.2 |
| 8,703,508 B2 * | 4/2014 | Chang | H01L 22/14 257/737 |
| 8,710,859 B2 * | 4/2014 | Chang | G01R 31/318513 257/777 |
| 8,988,095 B2 * | 3/2015 | Nakamura | G01R 1/0433 324/756.02 |
| 2002/0084532 A1 * | 7/2002 | Neogi | H01L 21/50 257/778 |
| 2004/0070414 A1 * | 4/2004 | Tani | G01R 1/0433 324/756.02 |
| 2005/0214173 A1 * | 9/2005 | Facer | B01L 3/502707 422/400 |
| 2008/0088331 A1 * | 4/2008 | Yoshida | G01R 1/0466 324/755.05 |
| 2009/0015282 A1 * | 1/2009 | Steps | G01R 31/2863 324/750.01 |
| 2009/0026199 A1 * | 1/2009 | Jeor | B65D 77/225 220/89.1 |
| 2009/0128177 A1 * | 5/2009 | Ohta | G01R 1/0458 324/756.02 |
| 2009/0243644 A1 * | 10/2009 | Chang | G01J 1/04 324/756.02 |
| 2012/0168964 A1 * | 7/2012 | Kim | G01R 1/07307 257/777 |
| 2013/0076384 A1 * | 3/2013 | Chang | G01R 31/318513 324/754.01 |
| 2014/0002121 A1 * | 1/2014 | Khoche | H01L 22/14 324/750.3 |
| 2014/0051189 A1 * | 2/2014 | Kai-Jun | H01L 22/14 438/15 |
| 2014/0266281 A1 * | 9/2014 | Wang | G01R 1/0483 324/756.02 |
| 2015/0137844 A1 * | 5/2015 | Kikuchi | G01R 1/0466 324/750.03 |

* cited by examiner

TESTING HOLDERS FOR CHIP UNIT AND DIE PACKAGE

BACKGROUND

As semiconductor technologies evolve, three-dimensional integrated circuits emerge as an effective alternative to further reduce the physical size of a semiconductor chip. In a three-dimensional integrated circuit (3DIC), active circuits are fabricated on different wafers and each wafer die is stacked on top of another wafer die using pick-and-place techniques. Much higher density can be achieved by employing vertical stacking of integrated circuits. Furthermore, three-dimensional integrated circuits can achieve smaller form factors, cost-effectiveness, increased performance and lower power consumption.

DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

In the process of manufacturing three-dimensional integrated circuits, known good die (KGD) and known good stack (KGS) tests are often performed through various testing probe card at various stages during the manufacturing process. For example, probe card can be used to test KGDs, or electronic elements. The probe card may be coupled between an automatic testing equipment board and a semiconductor die under test. The probe cards make contact to the semiconductor die through a plurality of probe contacts.

In the state of the art, there is lack of low-cost solution to verify the incoming chips or diced chips provided by the customer as the known good dies. For example, there is lack of low-cost production solution for the chip on chip on substrate (CoCoS) configuration pre-bond probing to screen out the defective units before the packaging process, and the CoCoS configuration pre-bond probing for screening out the defective units before the packaging process is known to be tested manually nowadays. And, there is no setup tool solution for chip on wafer on substrate (CoWoS) configuration pre-bond probing to screen out the defective units before the packaging process. Also, there is no setup tool solution for the (CoCoS) configuration post-bond probing to screen out the defective units before the packaging process. Thus, there is a need to solve the above-mentioned problems.

Figure 1:
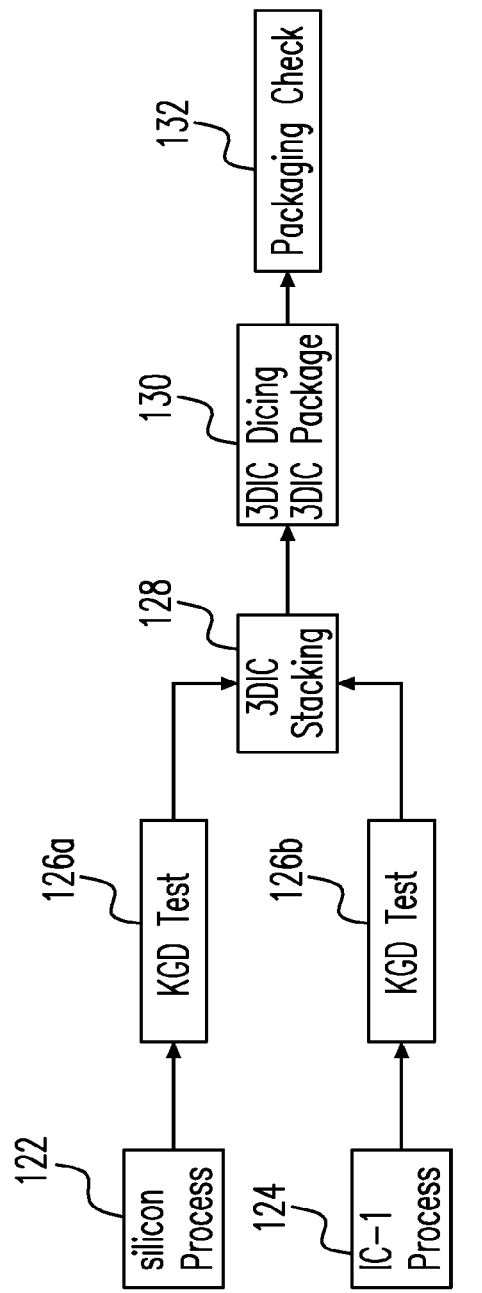
FIG. 1 illustrates a testing flow of a 3DIC in accordance with various embodiments of the present disclosure.
Figure 6A:
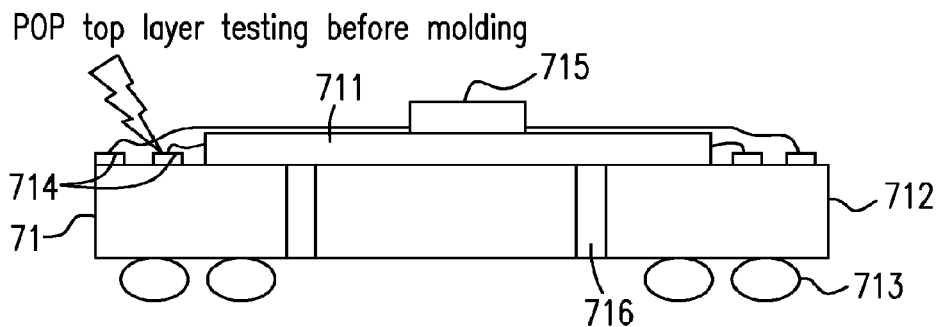
FIGS. 6(a) and 6(b) are respectively a schematic diagram of the top package being flipped for a mono top layer testing and a bottom package being flipped for a mono bottom layer testing according to some embodiments of the present disclosure.

FIG. 1 illustrates a testing flow of a 3DIC in accordance with various embodiments of the present disclosure. A 3DIC device (not shown) may comprise a plurality of semiconductor dies bonded on an interposer (see the interposer 712, e.g. a substrate, as shown in FIG. 6(a)). In a conventional testing solution, the plurality of semiconductor dies are bonded on an interposer to form a three dimensional integrated circuit. The 3DIC is subsequently probed by testing equipment to test various system level characteristics. If the 3DIC fails the tests, the plurality of semiconductor dies may be discarded because the rework cost is significant.

Figure 6B:
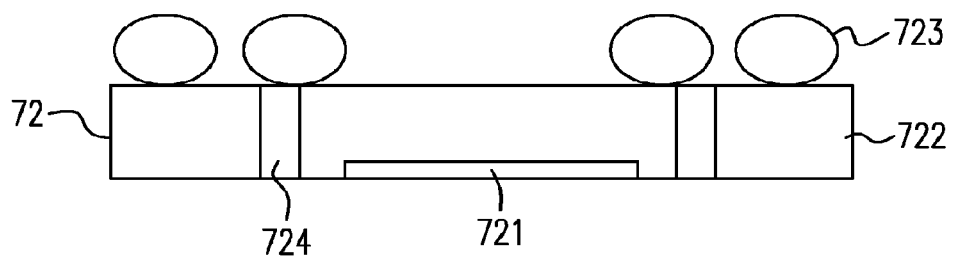

The testing flow of FIG. 1 shows an all-in-one test solution to screen out the failed die so as to reduce system level failures. As shown in FIG. 1, a plurality of semiconductor dies may be fabricated in a silicon process 122. A KGD test may be performed on the plurality of semiconductor dies (e.g. provided by the suppliers) at operation 126a. After the semiconductor dies pass the KGD test, the semiconductor dies are designated as known good dies. The known good dies are mounted on a testing substrate. A device-under-test may be fabricated in a wafer at a fabrication process shown at operation 124 (e.g., the IC-1 process is used to produce the interposer 722 as shown in FIG. 6(b) in some embodiments). For example, a KGD test may be performed on the manufactured interposers at operation 126b in some embodiments.

After the semiconductor dies of the 3DIC are tested and passed the tests described above, the known good dies (e.g. 711 and 715 of FIG. 6(a)) are stacked together or stacked on a tested but passed the test interposer (e.g. a substrate as shown in FIG. 6(a)) depending on different designs and applications at operation 128. Subsequently, a dicing process may be performed to form a plurality of individual chip packages at operation 130. At operation 132, a packaging check may be applied to the individual chip packages.

One advantageous feature of the testing flow shown in FIG. 1 is that the semiconductor dies are tested prior to a stacking process. As such, the system level failure rate may be reduced. The reduced system level failure rate may help to shorten the test cycle time and improve test quality. As a result, the manufacture cost of 3DICs can be reduced.

The present disclosure provides a testing holder for a chip unit of a 3DIC, a multi site holding frame for testing plural chip units of a 3DIC simultaneously and a method for testing a die thereof to verify the diced chip or die package, enhance the quality of the diced chip or die package and save the production time and stacking costs of the 3DIC.

The present disclosure relates to a testing holder for testing a chip unit of a 3DIC, and a multi site holding frame having plural testing holders for testing plural chip units of a 3DIC simultaneously.

Figure 2A:
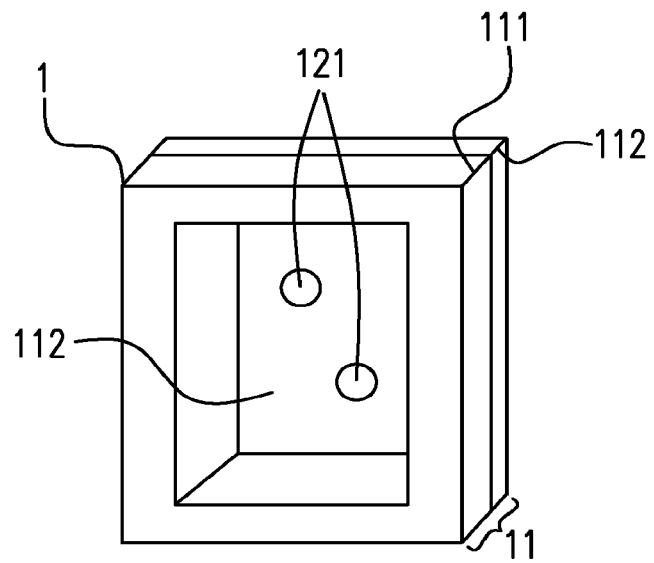
FIGS. 2 (a) and 2(b) are respectively a schematic diagram of a testing holder with holes on its bottom plate and a testing holder with a trench on its surrounding wall according to some embodiments of the present disclosure.

FIG. 2(a) is a schematic diagram of a testing holder with holes on its bottom plate according to some embodiments of the present disclosure. In FIG. 2(a), a testing holder 1 for a chip unit (a diced chip, e.g. a die package/die package with a single die/package on package (PoP)) in a testing phase includes a holder body 11 including a surrounding wall 111 and a bottom plate 112 for containing the chip unit (e.g. an inserting die package), the bottom plate 112 includes a heat conduct plate, and there are two holes 121 on the bottom plate 112. These two holes are functioned as a pressure releasing device formed on the holder body 11 (in some embodiments, one or more than two holes can be used) to release an insertion pressure when the chip unit (e.g. the die package) is inserted in the holder body 11 such that the air under the inserted chip unit could be released via the two holes 121 smoothly so as to avoid any edge scratch of the inserted chip unit caused by the collision with the test holder 1 due to the turbulence of the squeezed out-flowing air. FIG. 2(a) illustrates a perspective view of the testing holder 1.

Figure 2B:
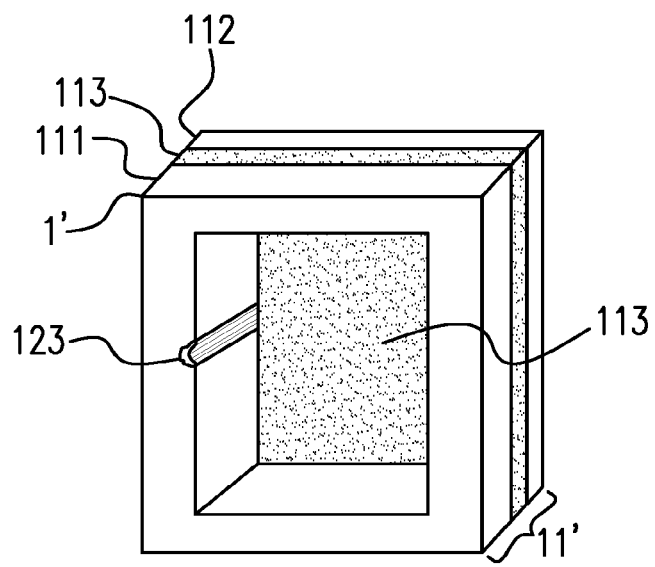

FIG. 2(b) is a schematic diagram of a testing holder with a trench on its surrounding wall according to some embodiments of the present disclosure. In FIG. 2(b), it shows a porous metal plate 113 (e.g. Cu—Ni) disposed under the surrounding wall 111, and the surrounding wall 111 further has a trench 123. The trench 123 is a recess behind the wall (can be one or more), being another pressure releasing device to release an insertion pressure when the chip unit (e.g. the die package) is inserted in the holder body 11'.

The air under the inserted chip unit could be released via the trench 123 smoothly so as to avoid any scratch of the inserted chip unit caused by the collision with the test holder 1' due to the turbulence of the squeezed out-flowing air, wherein the porous metal plate 113 absorbs a stress from the insertion of the chip unit to prevent a warpage of the chip unit, the bottom plate 112 is a heat conduct plate for absorbing a heat generated from a heat source contacting the bottom plate 112 or dissipating a heat generated by the testing holder such that the testing holder is operated under various temperatures according to respective requirements, the porous metal plate 113 is disposed on the heat conduct plate 112, and the surrounding wall 111 is disposed on the porous metal plate 113. FIG. 2(b) illustrates a perspective view of the testing holder 1'.

Figure 3A:
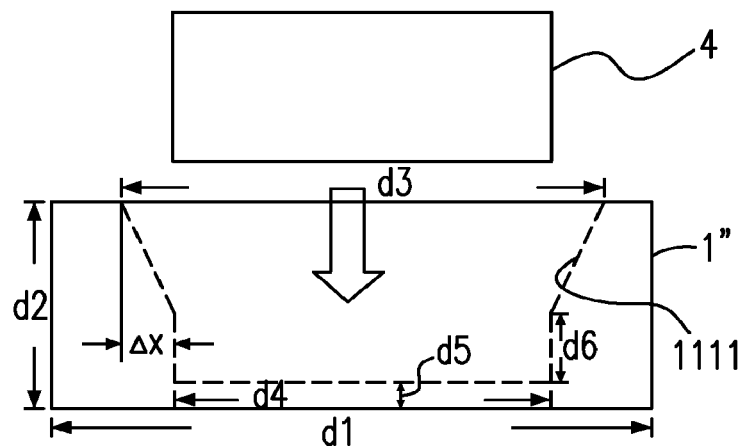
FIGS. 3(a) and 3(b) are respectively a schematic diagram of a testing holder with a tilted surface on its surrounding wall and a testing holder with an inserted die package having a height larger than the height of the testing holder according to some embodiments of the present disclosure.

FIG. 3(a) is a schematic diagram of a testing holder with a tilted surface on its surrounding wall according to some embodiments of the present disclosure. In FIG. 3(a), for a testing holder 1", its surrounding wall further has a tilted surface 1111 with a thickness of ΔX (e.g. in a range from about 0.1 mm to about 1 mm) to guide therein an insertion of the incoming diced chip (e.g., a die package 4 with plural stacked dies, wherein each of the stacked dies has a thickness of, e.g., 0.5 mm) and to avoid an edge scratch on the incoming diced chip.

The incoming diced chip is one selected from a group consisting of a package on package (PoP), a die package and a die package with a single die. This design is dependent on the design of the die. As shown in FIG. 3(a), e.g., in some embodiments, d1 is in a range from about 1.4 cm to about 10.4 cm, d2 depending on the thickness of the diced chip is in a range from about 0.2 mm to about 2 mm, d3 is in a range from about 1.2 cm to about 10.2 cm, d4 is in a range from about 1 cm to about 10 cm, d5 is in a range from about 0.1 mm to about 1 mm, d6 is in a range from about 0.1 mm to about 1 mm and d4<d1. FIG. 3(a) is a cross-sectional view of the test holder 1".

Figure 3B:
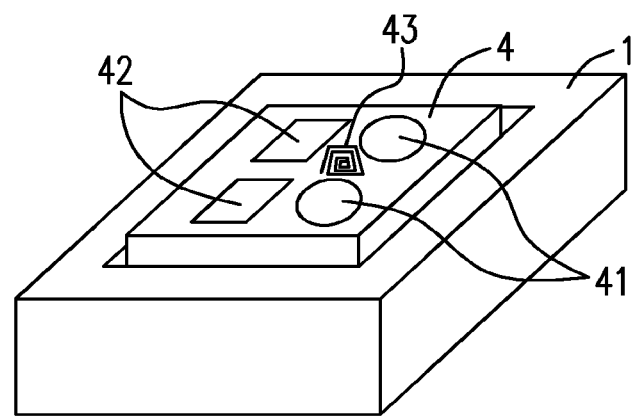

FIG. 3(b) is a schematic diagram of a testing holder with an inserted die package having a height larger than the height of the testing holder according to some embodiments of the present disclosure. As shown in FIG. 3(b), the inserted die package 4 is engaged in a single site probing via a test contactor, and the test contactor is one selected from a bump (e.g. a controlled collapse chip connection (C4) 41, or a ball grid array (BGA)), a pad 42, a contactless coil 43, a hybrid contactless, or a combination thereof.

Wherein when the contactless coil 43 is used and a multi site probe card with plural contactless coil thereon (not shown) is approached to the contactless coil 43 within a predetermined distance rather than directly contacted, the contactless coil 43 and the corresponding contactless coil on the multi site probe card are electrically coupled to engage in the single site probing. In addition to the surface of the die package 4 is above the surface of the testing holder 1 as shown in FIG. 3(b), the surface of the die package 4 can be flush or below the surface of the testing holder 1. FIG. 3(b) illustrates a perspective view of the testing holder 1.

Figure 4A:
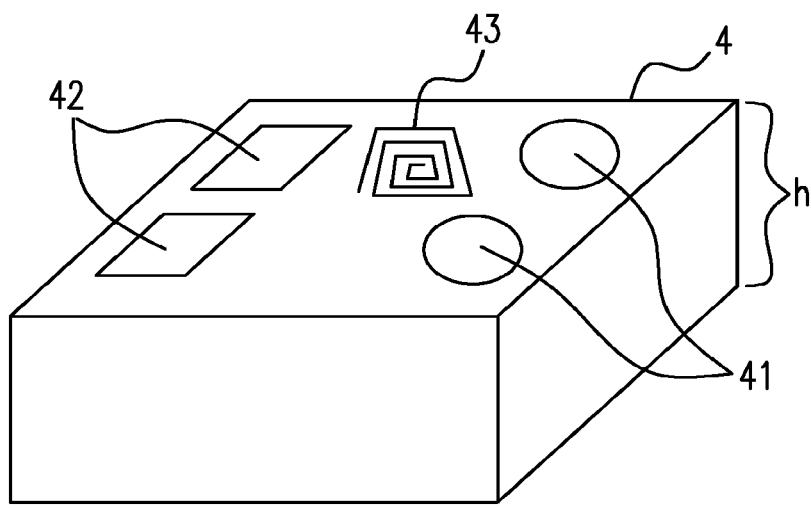
FIGS. 4(a) and 4(b) are respectively a schematic diagram of a die package with a height of h and a die without package disposed on a dummy die with a total height of h according to some embodiments of the present disclosure.

FIG. 4(a) is a schematic diagram of a die package with a height of h according to some embodiments of the present disclosure. In FIG. 4(a), the die package 4 has a height of h and a test contactor being one selected from a bump (e.g. a C4 41), a pad 42, a contactless coil 43, a hybrid contactless, or a combination thereof. FIG. 4(a) is a perspective view of the die package 4.

Figure 4B:
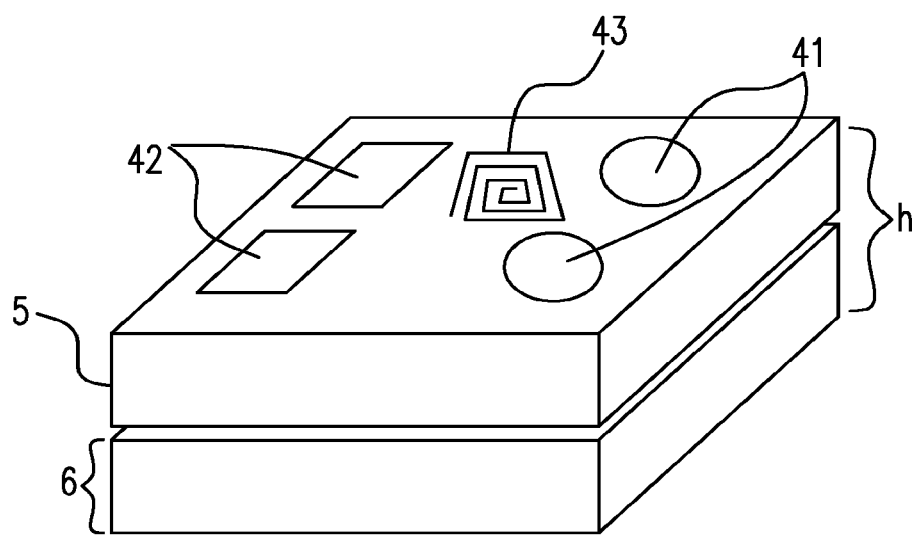

FIG. 4(b) is a schematic diagram of a die without package disposed on a dummy die with a total height of h according to some embodiments of the present disclosure. The die package with a single die 5 is stacked on the dummy die 6 to provide an added height. In FIG. 4(b), the die package with a single die 5 and the dummy die 6 have a total height of h, the same as that of the die package 4 as shown in FIG. 4(a). The die package with a single die also has the test contactor being one selected from a bump (e.g. a C4 41), a pad 42, a contactless coil 43, a hybrid contactless, or a combination thereof. FIG. 4(b) is a perspective view of the die package with the single die 5 disposed on the dummy die 6.

Figure 5A:
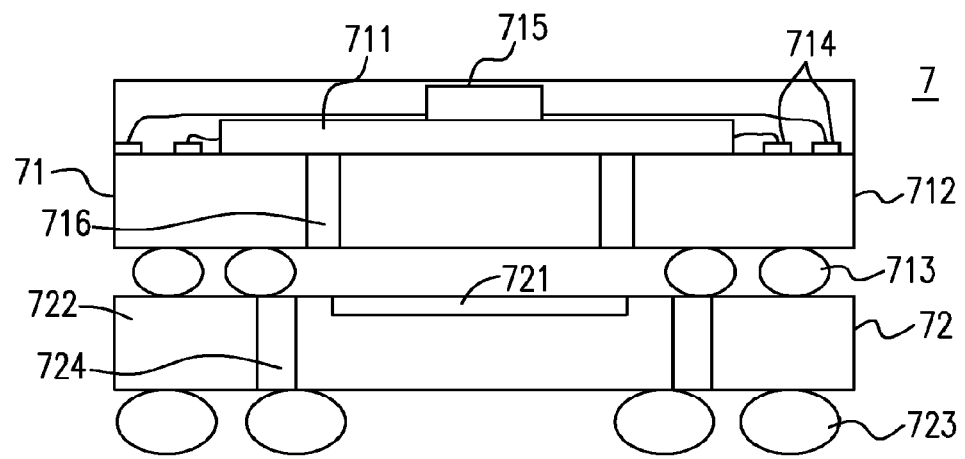
FIGS. 5(a) and 5(b) are respectively a schematic diagram of a PoP package before engaged in a PoP package testing and the PoP package being flipped for the PoP package testing according to some embodiments of the present disclosure.

A PoP package also needs to be tested. FIG. 5(a) is a schematic diagram of a PoP package before engaged in a PoP package testing according to some embodiments of the present disclosure. In FIG. 5(a), the PoP package 7 includes the top package 71 and the bottom package 72, wherein the top package 71 includes a chip unit 711, a chip unit 715 disposed on the chip unit 711, an interposer 712, plural C4s 713, plural test contactors (e.g. a probing pad 714) and two through-silicon vias (TSVs) 716, and the bottom package 72 includes a chip unit 721, an interposer 722, plural BGAs 723 and two TSVs 724. FIG. 5(a) is a cross-sectional view of the PoP package 7.

Figure 5B:
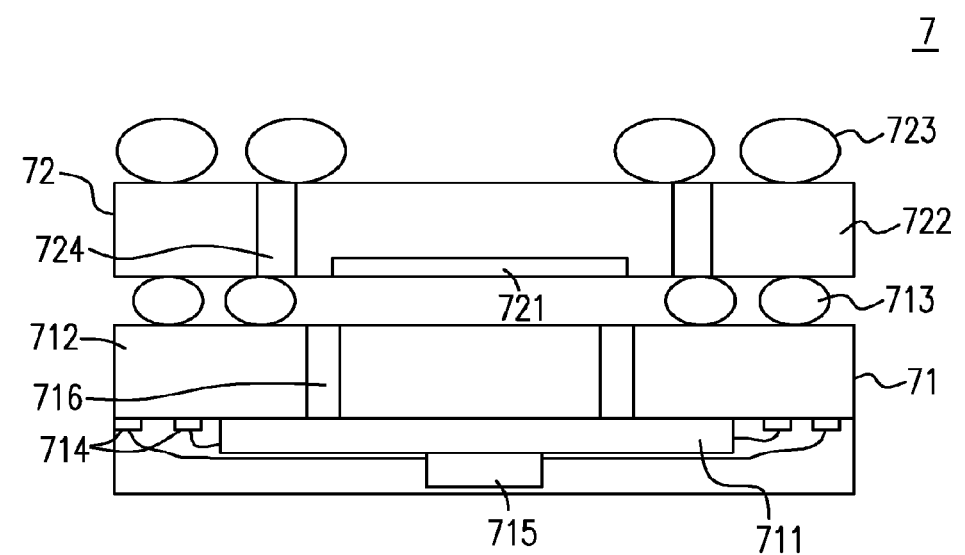

FIG. 5(b) is a schematic diagram of the PoP package being flipped for the PoP package testing according to some embodiments of the present disclosure. In FIG. 5(b), the PoP package 7 is flipped for engaging the package testing via a test contactor, e.g. one of the plural BGAs 723. FIG. 5(b) is a cross-sectional view of the flipped PoP package 7.

A top package or a bottom package of a PoP package needs to be tested (e.g. a probing) before being packaged. The top package and the bottom package are respectively inserted into a test holder 1, 1' or 1" for the aforementioned test (e.g. the probing). FIG. 6(a) is a schematic diagram of a top package before engaged in a top package testing before molding according to some embodiments of the present disclosure. In FIG. 6(a), the top package 71 includes a chip unit 711, a chip unit 715 disposed on the chip unit 711, an interposer 712, plural C4s 713 (each of the C4s 713 is a specific one of the C4s 41 as shown in FIG. 3(b)), plural test contactors (e.g. a probing pad 714) and two TSVs 716. FIG. 6(a) is a cross-sectional view of the top package 71.

FIG. 6(b) is a schematic diagram of a bottom package being flipped for a mono bottom layer testing according to some embodiments of the present disclosure. As shown in FIG. 6(b), the bottom package 72 includes a chip unit 721, an interposer 722, plural BGAs 723 and two TSVs 724. In FIG. 6(b), the bottom package 72 is flipped for engaging the mono bottom layer testing via a test contactor, e.g. one of the plural BGAs 723. FIG. 6(b) is a cross-sectional view of the flipped bottom package 72.

Figure 7A:
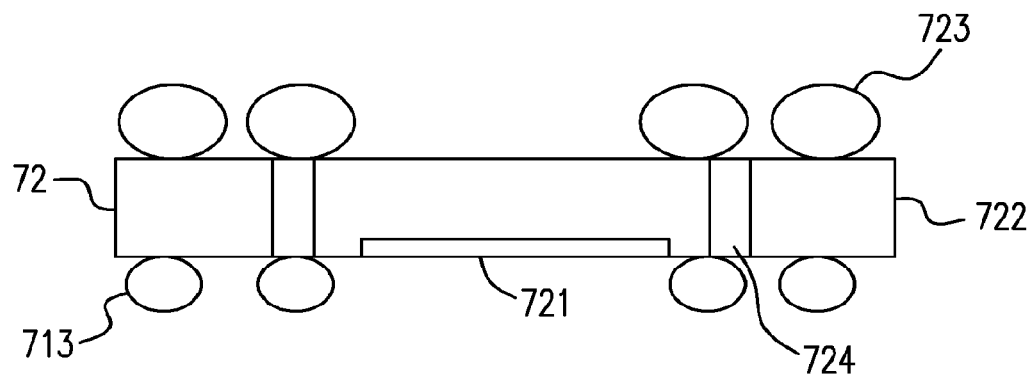
FIGS. 7(a) and 7(b) are respectively a schematic diagram of a bottom package being flipped for a twin sides bump out testing using plural BGAs and plural probing pads according to some embodiments of the present disclosure.

FIG. 7(a) is a schematic diagram of the bottom package being flipped for a twin sides bump out testing via plural BGAs according to some embodiments of the present disclosure. In FIG. 7(a), a bottom package 72 includes a chip unit 721, an interposer 722, plural BGAs 723, two TSVs 724 and plural C4s 713. FIG. 7(a) is a cross-sectional view of the flipped bottom package 72.

Figure 7B:
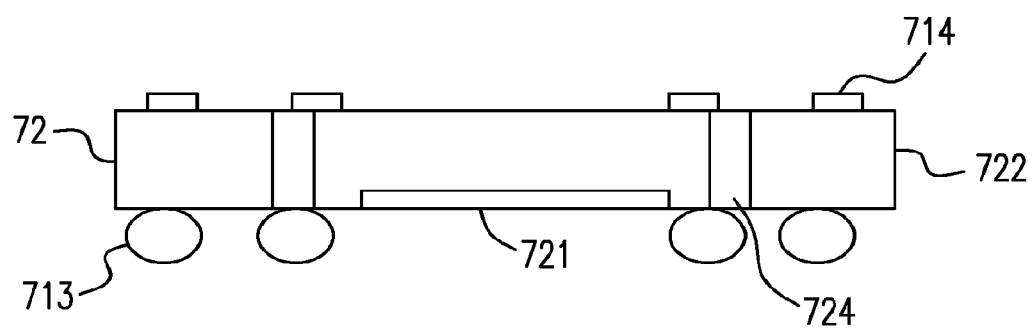

FIG. 7(b) is a schematic diagram of a bottom package being flipped for a twin sides bump out testing via plural probing pads according to some embodiments of the present disclosure. In FIG. 7(b), a bottom package 72 includes a chip unit 721, an interposer 722, plural probing pads 714, two TSVs 724 and plural C4s 713. FIG. 7(b) is a cross-sectional view of the flipped bottom package 72.

Figure 8A:
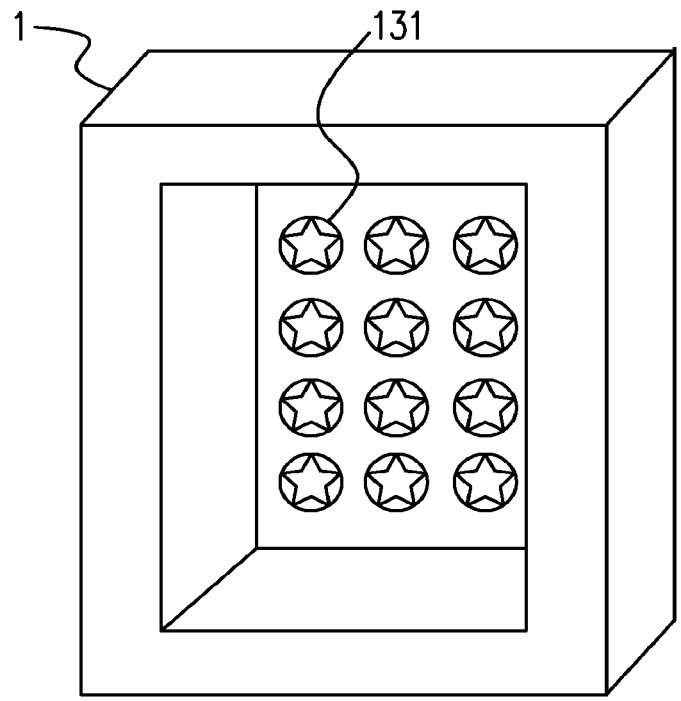
FIGS. 8(a) and 8(b) are respectively a schematic diagram of a testing holder with plural pogo pins disposed on its bottom plate and a PoP twin sides bump out being inserted into a testing holder with the plural pogo pins disposed on the bottom plate therein according to some embodiments of the present disclosure.

FIG. 8(a) is a schematic diagram of a testing holder with plural pogo pins disposed on its bottom plate according to some embodiments of the present disclosure. In FIG. 8(a), the testing holder 1 includes plural pogo pins 131 for absorbing a contact stress from the insertion of the PoP. As shown in FIG. 8(a), the testing holder 1 is used to contain a chip unit, e.g. the bottom package 72 as shown in FIG. 7(a) or FIG. 7(b) for the twin sides bump out testing. FIG. 8(a) is a perspective view of the testing holder 1.

Figure 8B:
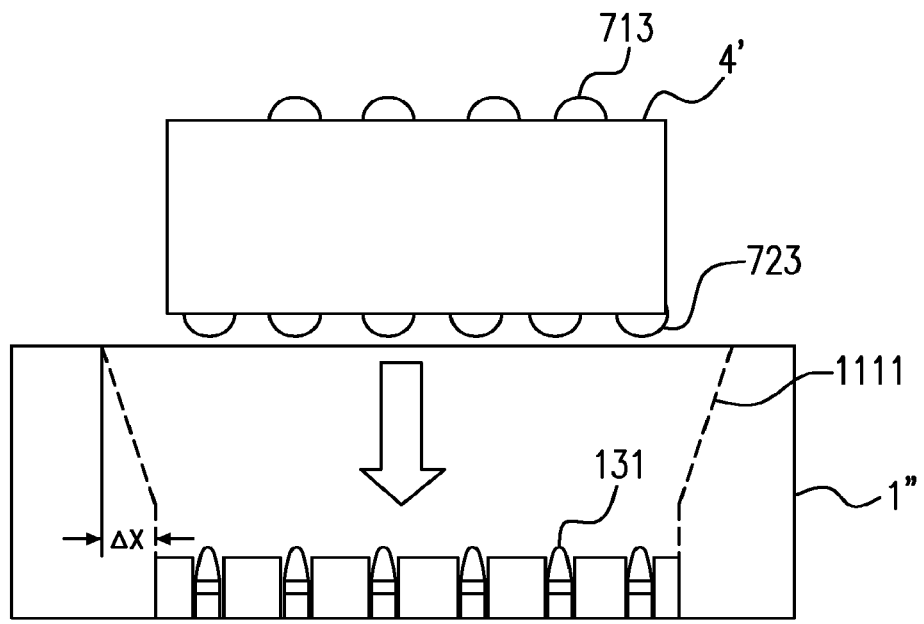

FIG. 8(b) is a schematic diagram showing a PoP twin sides bump out being inserted into a testing holder with plural pogo pins disposed on the bottom plate therein according to some embodiments of the present disclosure. In FIG. 8(b), the testing holder 1" includes a tapered surface with a thickness of $\Delta X$ is used to guide therein an insertion of the PoP twin sides bump out 4' to be engaged in a twin sides bump out testing via a test contactor being one of plural bumps (e.g. C4s 713, or BGAs 723), which could be the bottom package 72 as shown in FIG. 7(a) or FIG. 7(b) and to avoid an edge scratch on the PoP twin sides bump out 4'. The testing holder 1" includes plural pogo pins 131 for absorbing a contact stress from the insertion of the PoP twin sides bump out 4' with plural C4s 713 and plural BGAs 723. FIG. 8(b) is a cross-sectional view of the testing holder 1" and the PoP twin sides bump out 4'.

Figure 9:
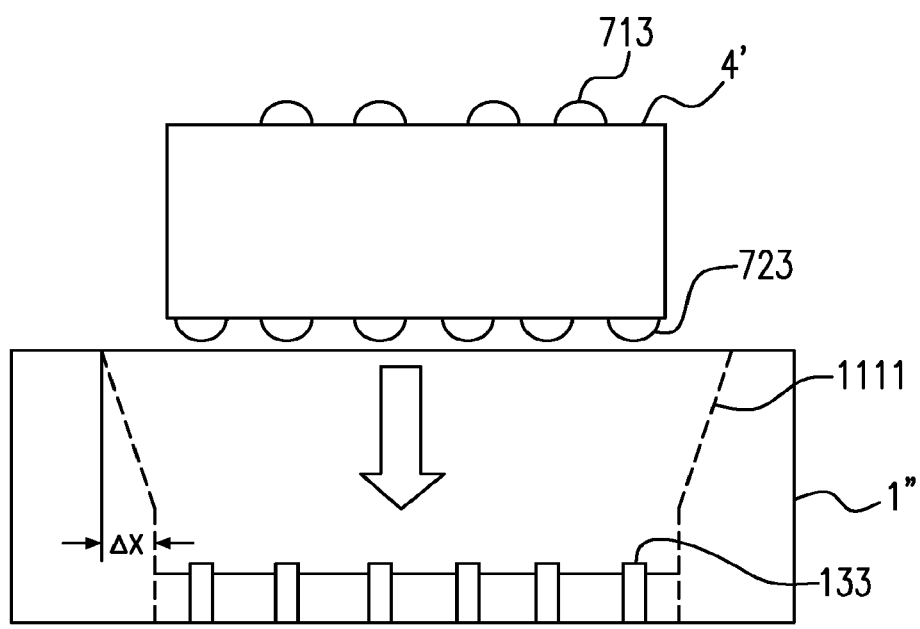
FIG. 9 is a schematic diagram showing a PoP twin sides bump out being inserted into a testing holder with plural soft spacers disposed on the bottom plate therein according to some embodiments of the present disclosure.

FIG. 9 is a schematic diagram showing a PoP twin sides bump out being inserted into a testing holder with plural soft spacers disposed on the bottom plate therein according to some embodiments of the present disclosure. In FIG. 9, the testing holder 1" is used to guide therein an insertion of the PoP twin sides bump out 4' and to protect the PoP twin sides bump out 4' to avoid an edge scratch thereon. The test holder 1" includes plural soft spacers 133, each of the plural soft spacers 133 is one selected from a group consisting of a rubber, a super button and a nanopierce, for absorbing a contact stress from the insertion of the PoP twin sides bump out 4' with plural C4s 713 and plural BGAs 723. As shown in FIG. 9, the testing holder 1" is used to contain a chip unit, e.g. the bottom package 72 as shown in FIG. 7(a) or FIG. 7(b) for the twin sides bump out testing. FIG. 9 is a cross-sectional view of the testing holder 1" and the PoP twin sides bump out 4'.

Figure 10:
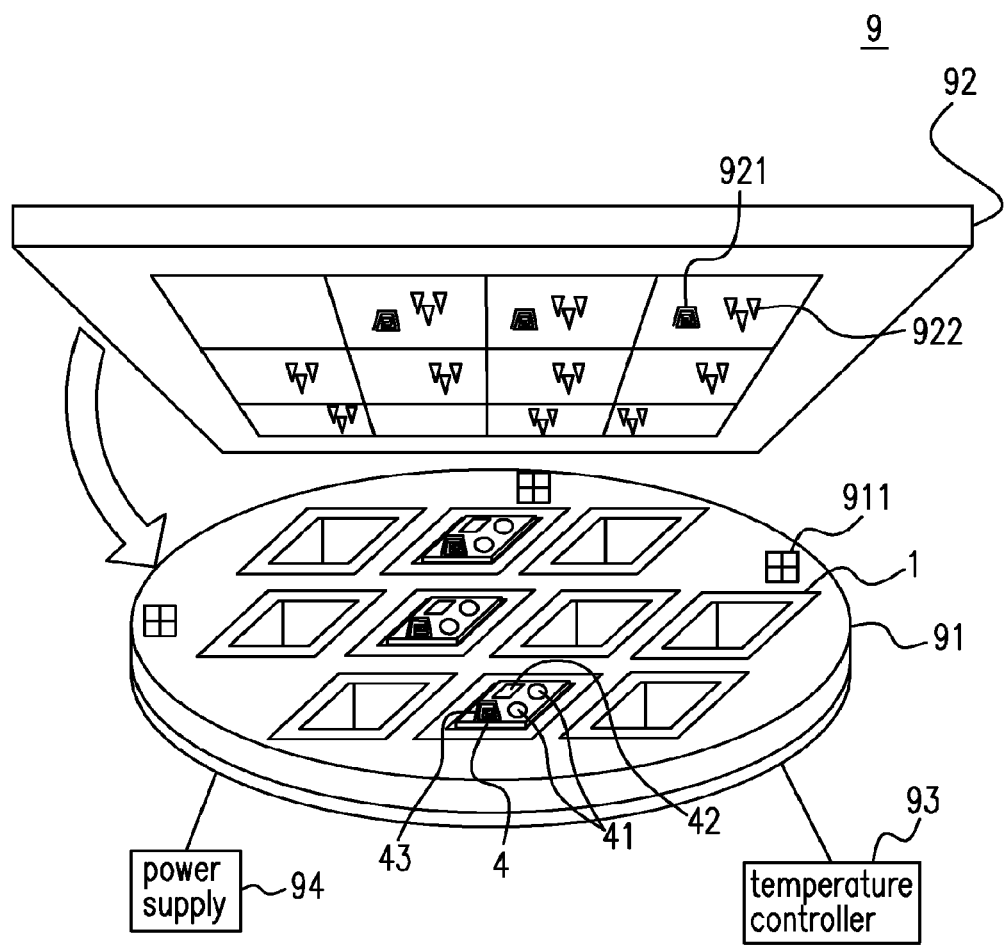
FIG. 10 is a schematic diagram of a multi site holding frame according to some embodiments of the present disclosure.

FIG. 10 is a schematic diagram of a first multi site holding frame according to some embodiments of the present disclosure. In FIG. 10, a multi site holding frame 9 for plural chip units in a testing phase includes a first holder frame 91, a multi site probe card 92, a temperature controller 93 and a power supply 94. The first holder frame 91 has a plurality of testing holders 1, each of which has an holder body containing a specific one of the plural chip units (e.g., die package 4 including two C4s 41, a pad 42 and a contactless coil 43), and plural alignment marks 911 for frame positioning. The multi site probe card 92 has plural probe contacts 922 and plural contactless coils 921 to probe a contact or a contactless transmission. When a respective C4 41 or a respective pad 42 of a specific die package 4 is used as the test contactor, the respective probe contact 922 is used to probe a contact transmission. When a respective contactless coil 43 of a specific die package 4 is used as the test contactor, the respective contactless coil 921 of the multi site probe card 92 is used to probe a contactless transmission, and the contactless transmission is probed when the multi site probe card 92 is approaching the first holder frame 91 and the distance between the respective contactless coil 921 and the corresponding contactless coil 43 is smaller than a predetermined value such that the respective contactless coil 921 and the corresponding contactless coil 43 are electrically coupled.

The temperature controller 93 is used to control the operating temperature of the multi site holding frame 9, and the power supply 94 is used to provide the electric power for a heater (not shown) contacting the first holder frame 91 to raise the temperature of the first holder frame 91 such that the multi site holding frame 9 operates under various temperatures according to respective requirements. In general, the operating temperature of the multi site holding frame 9 is in a range of from about −50° C. to about +150° C. FIG. 10 is a perspective view of the multi site holding frame 9.

Figure 11A:
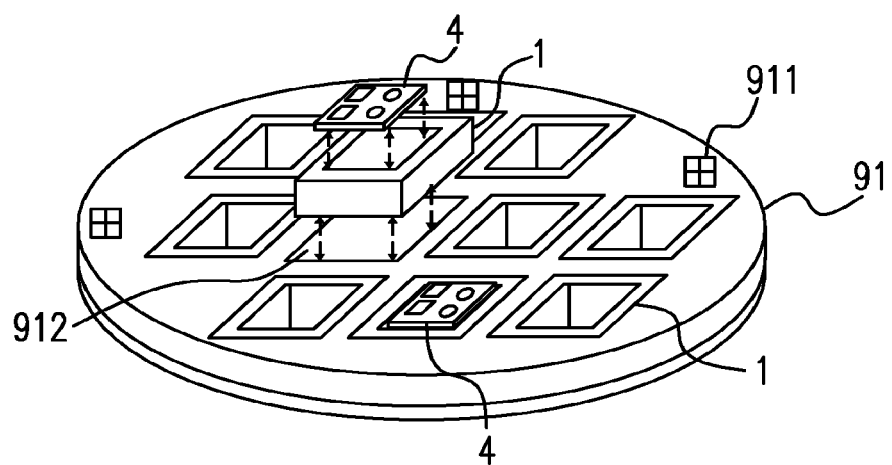
FIGS. 11(a) and 11(b) are respectively a schematic diagram showing a testing holder in a holder frame of a multi site holding frame being replaceable and two testing holders in a holder frame of a multi site holding frame having the same outer dimensions and different inner dimensions according to some embodiments of the present disclosure.

FIG. 11(a) is a schematic diagram showing a testing holder in a first holder frame of a multi site holding frame being replaceable according to some embodiments of the present disclosure. Each of the plurality of testing holders 1 being inserted into a respective open recess 912 and having a holder body containing a specific one of the plural chip units (die package 4) in the first holder frame 91 is replaceable, and the first holder frame 91 is reusable. FIG. 11(a) is a perspective view of the first holder frame 91.

Figure 11B:
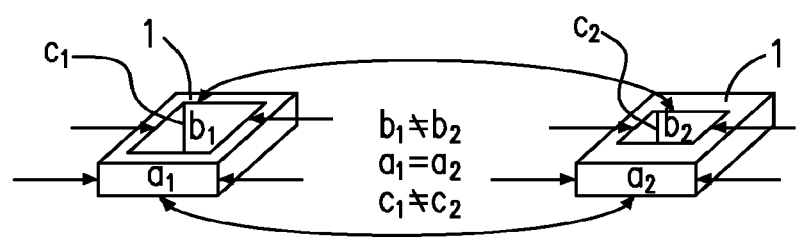

FIG. 11(b) is a schematic diagram showing two testing holders in a first holder frame of a multi site holding frame having the same outer dimensions and different inner dimensions according to some embodiments of the present disclosure. All of the testing holders 1 have the same outer dimensions, and the inner dimensions of each of the plurality of the testing holders are adapted to a size of the incoming diced chip. In FIG. 11 (b), for example, the outer dimensions of the two testing holders 1 are the same, i.e. $a_1=a_2$, and the inner dimensions of the two testing holders 1 are different from each other, i.e. $b_1 \neq b_2$ and $c_1 \neq c_2$. Other combinations of relationships between $a_1$, $a_2$; $b_1$, $b_2$; and $c_1$, $c_2$ are also possible. FIG. 11(b) is a perspective view of the two testing holders 1.

Figure 12A:
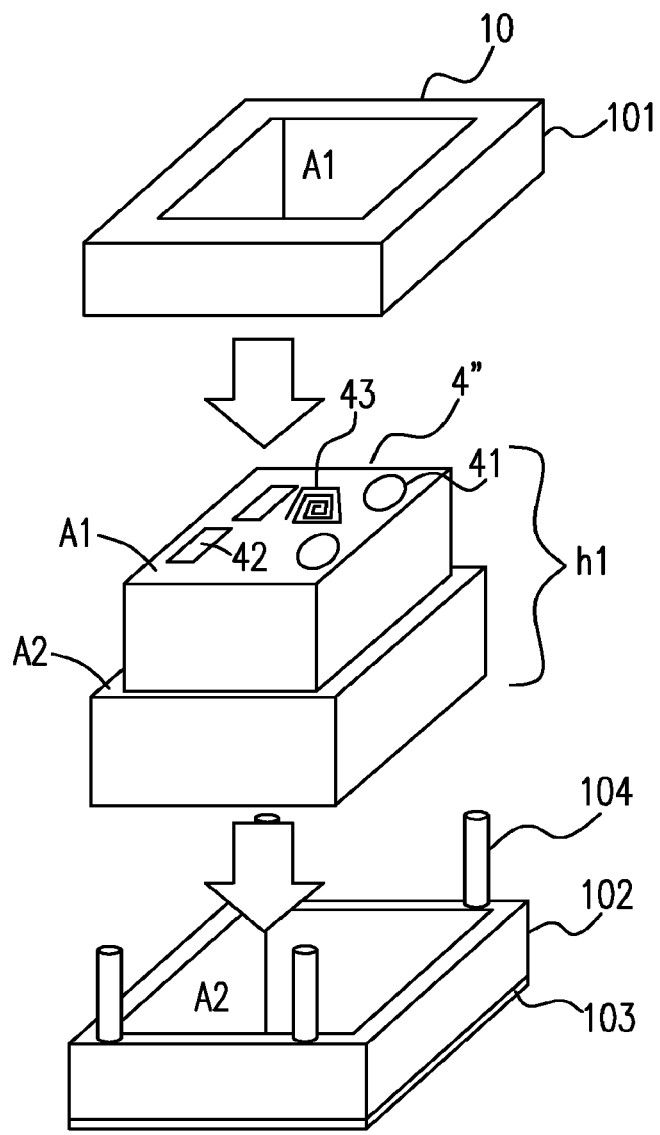
FIGS. 12(a) and 12(b) are respectively a schematic diagram showing a die package with its upper size smaller than its lower size being inserted into a testing holder and the testing holder with the inserted die package for a single site probing according to some embodiments of the present disclosure.

FIG. 12(a) is a schematic diagram showing a die package with its upper size smaller than its lower size being inserted into a testing holder according to some embodiments of the present disclosure. In FIG. 12(a), the die package 4" includes two C4s 41, two pads 42, a contactless coil 43, a device height h1, an upper size A1, and a lower size A2 ($\geq$A1), and is inserted into a testing holder 10. The testing holder 10 includes an upper surrounding wall 101 with two openings having a size A1, a lower surrounding wall 102 with an opening having a size A2>A1, and a bottom plate 103. In some embodiments, A2$\leq$A1. The upper surrounding wall 101 and the lower surrounding wall 102 are connected by plural guide pins 104 for probing the die package 4" (e.g., the PoP package 7 as shown in FIG. 5(a) or FIG. 5(b)). FIG. 12(a) is a perspective view of the testing holder 10 and the die package 4" to be inserted therein.

Figure 12B:
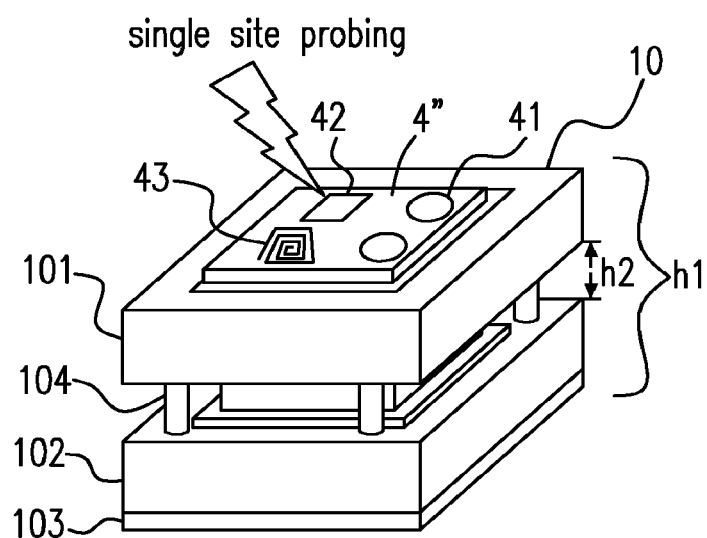

FIG. 12(b) is a schematic diagram showing the testing holder with the inserted die package for a single site probing according to some embodiments of the present disclosure. In FIG. 12(b), the inserted die package 4" including two C4s 41, a pad 42, a contactless coil 43, a device height h1 and a distance between the upper surrounding wall 101 and the lower surrounding wall 102, h2 ($\geq$0), is engaged in a single site probing. The plural guide pins 104 are omitted when h2=0. FIG. 12(b) is a perspective view of the testing holder 10 and the die package 4" being inserted therein.

Figure 13:
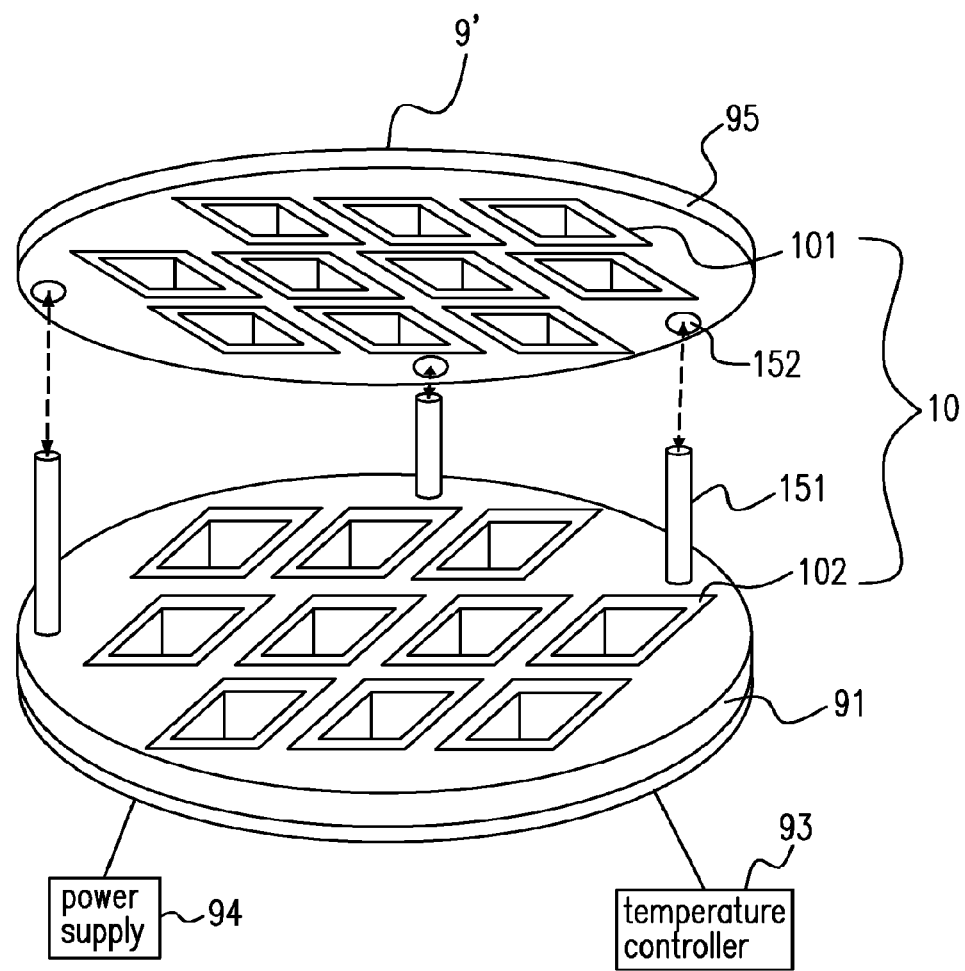
FIG. 13 is a schematic diagram of a multi site holding frame showing a first holder frame and a second holder frame according to some embodiments of the present disclosure.

FIG. 13 is a schematic diagram of a second multi site holding frame 9' showing a first holder frame 91, a temperature controller 93, a power supply 94 and a second holder frame 95 according to some embodiments of the present disclosure. The temperature controller 93 and the power supply 94 are the same as those of FIG. 10. In FIG. 13, the second holder frame 95 and the first holder frame 91 are connected by plural frame guiding pins 151. The second multi site holding frame 9' has plural testing holders 10, each of the plural testing holders 10 includes an upper surrounding wall 101, a lower surrounding wall 102 and a bottom plate 103 (not shown).

As shown in FIG. 12(a), the upper surrounding wall 101 and the lower surrounding wall 102 are connected by plural guide pins 104 in some embodiments. Each of the second holder frame 95 and the first holder frame 91 has plural guiding pin holes 152, the second holder frame 95 is used to contain all of the upper surrounding walls 101, the first holder frame 91 is used to contain all of the lower surrounding walls 102, and the second holder frame 95 and the first holder frame 91 are connected by the plural frame guiding pins 151 inserted into the plural guiding pin holes 152. The second multi site holding frame 9' also includes the multi site probe card 92 as shown in FIG. 10. FIG. 13 is a perspective view of the second multi site holding frame 9'.

The present disclosure provides various embodiments of test holder for testing a die before bonding to form the chip on chip on substrate (CoCoS) pre-bond testing, the chip on wafer on substrate (CoWoS) pre-bond testing, the (CoCoS) post-bond testing, and the package on package (PoP) testing to screen out the defective units. According to the aforementioned descriptions, the present disclosure provides a testing holder for a chip unit of a 3DIC, a multi site holding frame for testing plural chip units of a 3DIC simultaneously and a method for testing a die thereof to verify the diced chip or die package, enhance the quality of the diced chip or die package and save the production time and stacking costs of the 3DIC so as to possess the non-obviousness and the novelty.

Although embodiments of the present disclosure and its advantages have been described in detail, it should be understood that various changes, substitutions and alterations can be made herein without departing from the spirit and scope of the disclosure as defined by the appended claims.

In accordance with one aspect of the present disclosure, a multi site holding frame for testing plural chip units includes a holder frame. The first holder frame has a plurality of testing holders and each of the plurality of testing holders includes a holder body and a pressure releasing device. The holder body contains a specific one of the plural chip units. The pressure releasing device is formed on the holder body to release an insertion pressure when the specific one of the plural chip units is inserted in the holder body.

In accordance with another aspect of the present disclosure, a method for testing an alleged known good die includes steps of providing a wiring layout and a testing holder, inserting the alleged known good die into the testing holder, and testing the alleged known good die via the testing holder to determine whether the known good die is a defective unit. The wiring layout is electrically connected to the alleged known good die. The testing step proceeds before electrically connecting the wiring layout to the alleged known good die.

In accordance with one more aspect of the present disclosure, a testing holder for a chip unit in a testing phase includes a holder body and a pressure releasing device. The holder body is used to contain the chip unit. The pressure releasing device is formed on the holder body to release an insertion pressure when the chip unit is inserted in the holder body.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A testing holder for a chip unit, comprising:
a holder body containing the chip unit; and
a pressure releasing device formed on the holder body to release an insertion pressure when the chip unit is inserted in the holder body,
wherein the holder body comprises a bottom plate, and
the chip unit includes a bottom surface facing the bottom plate and an opposing top surface on which a test contactor is disposed.

2. The testing holder of claim 1, wherein the holder body further comprises a surrounding wall, the chip unit is a diced chip of a 3DIC, and the surrounding wall defines an inner space for containing and testing the diced chip.

3. The testing holder of claim 2, wherein the surrounding wall further has a tilted surface to guide therein an insertion of the diced chip and to avoid an edge scratch on the diced chip, and the diced chip is one selected from a group consisting of a package on package (PoP), a die package and a die without package.

4. The testing holder of claim 3, wherein the die without package can be stacked on a dummy die to provide an added height.

5. The testing holder of claim 3, wherein the bottom plate comprises one set of a first set of plural pogo pins and a second set of plural soft spacers for absorbing a contact stress from the insertion.

6. The testing holder of claim 2, wherein the surrounding wall further has a trench being the pressure releasing device.

7. The testing holder of claim 2, wherein the bottom plate is a heat conduct plate having a hole being the pressure releasing device.

8. The testing holder of claim 2, wherein the holder body further comprises a porous metal plate absorbing a stress from the insertion of the chip unit to prevent a warpage of the chip unit, wherein the bottom plate is a heat conduct plate, the porous metal plate is disposed on the heat conduct plate, and the surrounding wall is disposed on the porous metal plate.

9. The testing holder of claim 2, wherein the holder body has an upper surrounding wall including a first and a second openings with a first size and a lower surrounding wall including a third opening with a second size, the upper surrounding wall and the lower surrounding wall are connected by plural guide pins, the diced chip has a third size and is insertable into the holder body via the first, the second and the third openings, and the first size is equal to the third size to fix the inserted diced chip.

10. The testing holder of claim 2, wherein the testing holder has an outer dimension kept unchanged and an inner dimension adapted to a size of the diced chip, the test contactor being one selected from a group consisting of a bump, a probing pad, a contactless coil, a hybrid contactless, and a combination thereof, and the diced chip is tested through the test contactor while the diced chip is inserted into the testing holder.

11. A multi site holding frame for plural chip units, comprising: a first holder frame having a plurality of testing holders, each of the plurality of testing holders including: a holder body containing a specific one of the plural chip units; and a pressure releasing device formed on the holder body to release an insertion pressure when the specific one of the plural chip units is inserted in the holder body,
wherein the holder body comprises a bottom plate, and
the specific one of the plural chip units includes a bottom surface facing the bottom plate and an opposing top surface on which a test contactor is disposed.

12. The multi site holding frame of claim 11 further comprising a second holder frame, plural frame guiding pins and a multi site probe card having plural probing devices to probe one of a contact and a contactless transmission, wherein the holder body has an upper surrounding wall including a first and a second openings and a lower surrounding wall including a third opening, the upper surrounding wall and the lower surrounding wall are connected by plural guide pins, and the specific one of the plural diced chip units is insertable into the holder body via the first, the second and the third openings.

13. The multi site holding frame of claim 12, wherein each of the second holder frame and the first holder frame has plural guiding pin holes, the second holder frame is used to contain all of the upper surrounding walls, the first holder frame is used to contain all of the lower surrounding walls, and the second holder frame and the first holder frame are connected by the plural frame guiding pins inserted into the plural guiding pin holes.

14. The multi site holding frame of claim 11, wherein the holder body has a surrounding wall, and the surrounding wall is disposed on the bottom plate and defines an inner space for containing and testing the specific one of the plural chip units.

15. The multi site holding frame of claim 11, wherein each of the plurality of testing holders is replaceable, and the first holder frame further comprises an alignment mark for frame positioning, and the first holder frame is reusable.

16. A method for testing a die, comprising: providing a testing holder; inserting the die into the testing holder; and testing the die via the testing holder to determine whether the die is a defective unit,
wherein the testing holder comprises a bottom plate, and
the die includes a bottom surface facing the bottom plate and an opposing top surface on which a test contactor is disposed.

17. The method of claim 16, wherein the die is a diced chip and the test contactor is one selected from a group consisting of a bump, a pad, a contactless coil, a hybrid contactless, and a combination thereof, and the diced chip is tested through the test contactor.

18. The method of claim 16, wherein the die is a diced chip subject to a PoP testing, a CoWoS/CoCoS pre-bond testing and a CoCoS post-bond testing to screen out the defective unit.

19. The method of claim 16, further comprising: providing plural diced chips of a 3DIC, each of the plural diced chips is the die, and a multi site holding frame including a holder frame having plural testing holders, each of which is the testing holder and is used for containing and testing a specific one of the plural diced chips; inserting the plural diced chips into the respective plural testing holders; and testing the plural diced chips via the respective plural testing holders simultaneously to determine whether each of the plural diced chips is a defective unit.

20. The method of claim 19, wherein the multi site holding frame further comprises a multi site probe card having plural probe cards for probing one of a contact and a contactless transmission, the holder frame further comprises an alignment mark for frame positioning, each of the plural testing holders is replaceable, the holder frame is reusable, each of the plural diced chips includes the test contactor being one selected from a group consisting of a bump, a probing pad, a contactless coil, a hybrid contactless, and a combination thereof, and each of the plural diced chips is tested through the test contactor.

* * * * *